United States Patent
Downey et al.

(10) Patent No.: US 6,442,381 B1
(45) Date of Patent: Aug. 27, 2002

(54) METHOD AND APPARATUS FOR DEFINING AND GENERATING LOCAL OSCILLATOR SIGNALS FOR DOWN CONVERTER

(75) Inventors: Walter J. Downey, Los Gatos; Mark Adrian Stubbs, Felton; Luna Chen, Mountain View; Philip H. Sutterlin, Saratoga, all of CA (US)

(73) Assignee: Echelon Corporation, San Jose, CA (US)

( * ) Notice: Subject to any disclaimer, the term of this patent is extended or adjusted under 35 U.S.C. 154(b) by 0 days.

(21) Appl. No.: 09/183,588

(22) Filed: Oct. 30, 1998

(51) Int. Cl.[7] ................................................. H04B 1/10
(52) U.S. Cl. ........................ 455/265; 455/318; 335/346
(58) Field of Search ................................ 455/255, 256, 455/265, 316, 317, 318, 319; 375/338, 339, 346

(56) References Cited

U.S. PATENT DOCUMENTS

| | | |
|---|---|---|
| 4,609,881 A | 9/1986 | Wells |
| 4,996,699 A | 2/1991 | Rudolph |
| 5,097,487 A * | 3/1992 | Walp ........................... 455/257 |
| 5,267,189 A | 11/1993 | Wilke |
| 5,495,206 A | 2/1996 | Hietala |
| 6,014,366 A * | 1/2000 | Ichiyoshi ..................... 375/261 |
| 6,018,553 A * | 1/2000 | Sanielevici et al. ......... 375/334 |

FOREIGN PATENT DOCUMENTS

| | | |
|---|---|---|
| DE | 35 21 288 A1 | 12/1886 |
| EP | 0 019 412 A1 | 5/1980 |
| GB | 2 252 879 A | 12/1988 |
| WO | WO 91/19360 | 12/1991 |

* cited by examiner

Primary Examiner—Edward F. Urban
Assistant Examiner—Tilahun Gesesse
(74) Attorney, Agent, or Firm—Blakely, Sokoloff, Taylor & Zafman LLP

(57) ABSTRACT

A method and apparatus for defining and generating a digital waveform such as used for the local oscillator for a down converter in a receiver is disclosed. The method and apparatus is particularly useful where the digital waveform is not an integer submultiple of a reference signal. A plurality of different digital waveforms meeting the timing criteria but having different combinations of segments needed to meet the timing criteria are generated. Each of the digital waveforms so generated are tested in, for instance, a receiver to enable the selection of the best combination of segments.

8 Claims, 3 Drawing Sheets

METHOD AND APPARATUS FOR DEFINING AND GENERATING LOCAL OSCILLATOR SIGNALS FOR DOWN CONVERTER

BACKGROUND OF THE INVENTION

1. Field of the Invention

The invention relates to the field of defining and generating digital waveforms such as used as the local oscillator input of a down converter where the signals are based on a reference signal, more particularly where the digital waveforms are not an integer submultiple of the frequency of the reference signal.

2. Prior Art

It is often necessary to generate a digital waveform which is synchronized with a higher frequency reference signal such as the reference signal from a crystal oscillator. Such digital waveforms have many applications and, for instance, are used as local oscillators of receivers having down converters, one of which will be described in conjunction with FIG. 1.

Ideally the digital waveform or local oscillator signal is some integer, submultiple of the reference signal permitting a divider, or the like, to be used to directly convert the reference signal to the frequency of the local oscillator. However, in many cases, other constraints in system design prevent the selection of a reference frequency which readily divides into the desired clocking frequency.

The present invention resulted from an application where a 10 MHz reference signal is divided to provide a local oscillator frequency of approximately 131 kHz (more precisely 10 MHz÷76) for a down converter. It was found necessary to add a second channel which would receive at approximately 115 kHz (more precisely 10 MHz÷86 6/7), while retaining the 10 MHz crystal oscillator of the prior system. The second local oscillator signal needed for the 115 kHz channel is not an integer submultiple of the 10 MHz reference frequency.

The prior art provides numerous solutions to this problem including, perhaps the most costly, adding a second crystal oscillator. Other prior art solutions include the use of a phase lock loop or the generation of a digital waveform based on two submultiples of the reference signal (e.g., 86 and 87). In this latter solution, the digital waveform is generated using, for instance, 87 counts of the 10 MHz clock for some predetermined number of cycles followed by a cycle of 86 counts to make up for the fact that the frequency of the desired digital waveform is larger than 10 MHz/87.

The specific prior art down converter in which the present invention is used is described in the Detailed Description of the Invention as it may be helpful to the understanding of the present invention.

SUMMARY OF THE INVENTION

A method for providing a periodic digital waveform of a predetermined frequency based on a higher frequency reference signal is disclosed. The digital waveform has a plurality of segments which are periodically repeated, each segment having a predetermined relationship to the higher frequency signal. A plurality of digital waveforms are first generated, each of which has its segments in a different order. Each of these digital waveforms still have the same predetermined frequency even though the order of the segments is different. Each of these digital waveforms is examined against some selected criteria such as in the case of the oscillator in a down converter, the performance of the receiver. From the examination of the plurality of digital waveforms, a particular digital waveform is selected and used again by way of example, as the local oscillator signal in the down converter.

DETAILED DESCRIPTION OF THE PRESENT INVENTION

A method for providing a digital waveform which is made up of a plurality of almost periodic segments is described. In the present invention numerous specific details are set forth such as specific frequencies, in order to provide a thorough understanding of the present invention. It will be apparent to one skilled in the art that the present invention may be practiced without these specific details. In other instances, well-known methods and structures, such as counters, have not been described in detail in order not to obscure the present invention.

Figure 1:
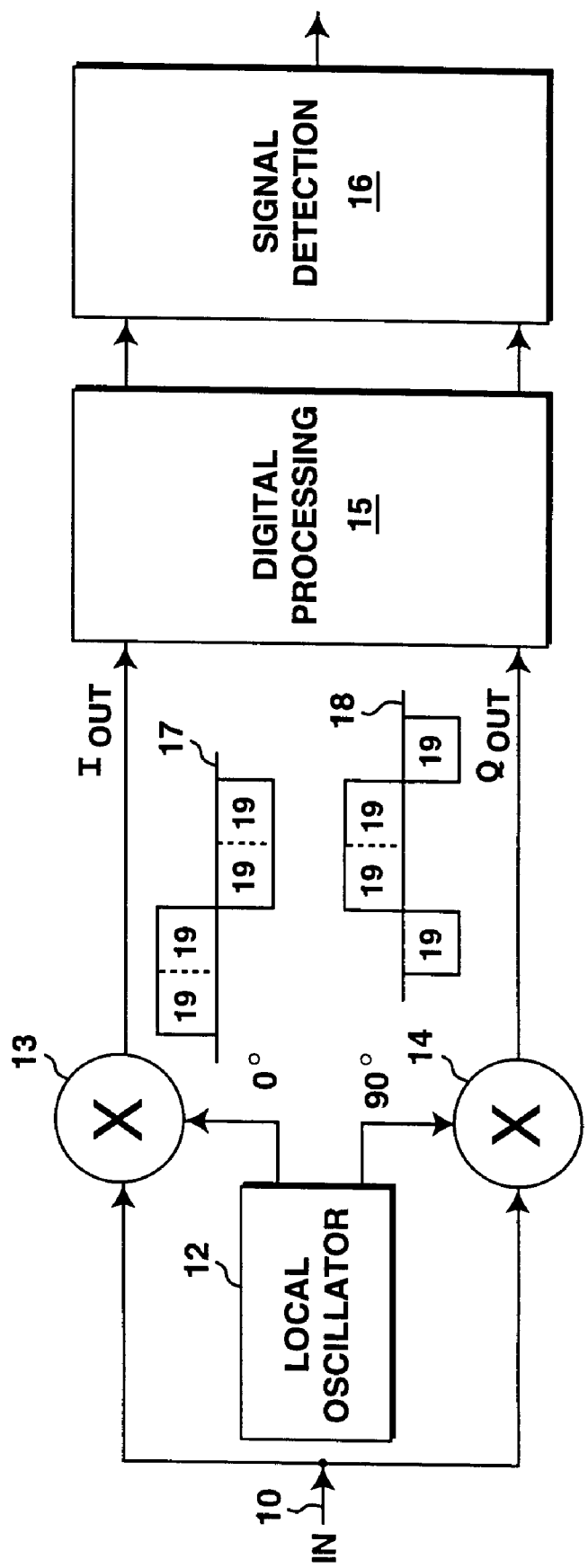
FIG. 1 is a block diagram of a prior art down converter in a receiver.

Referring first to FIG. 1 a down converter and other portions of a receiver for receiving a modulated carrier signal is illustrated. For instance, the receiver may be part of a power line transceiver which receives communication signals over a power line. Such transceivers are manufactured by Echelon Corporation of Palo Alto, Calif.

The power line signal, after some filtering, is sampled and the digital samples are applied to line 10 of the down converter of FIG. 1. In the multipliers 13 and 14, this input signal is multiplied by local oscillator signals from the oscillator 12. An oscillator signal and this signal shifted by approximately 90° are used in the multipliers. The signals may be, for instance, square wave or sine wave signals. The output of the multipliers is referred to commonly as the "I" and "Q" channels. Generally the signals in the I and Q channels receive some digital signal processing such as low pass filtering, shown by digital processing 15 in FIG. 1. Other well-known circuits may be used to detect the information signal as shown by signal detection circuit 16.

In one case, a transceiver employing the circuit of FIG. 1 uses a 10 MHz crystal oscillator as a reference signal. The down converter for a 131 kHz channel uses this 10 MHz reference signal (dividing by 76) to provide the local oscillator signals (dividing 19 to produce quadrature signals) for the multipliers.

This is shown in FIG. 1 where on time axis 17, one cycle of the 0° phase local oscillator waveform comprises a first segment having two 19 counts (total of 38 counts) and a second segment having two 19 counts. On time axis 18, the 90° phase waveform begins with a 19 count segment to provide the 90° shift. Then there is a segment having two 19 counts followed by another segment with a count of 19 to complete the cycle.

The present invention arose in an effort to add a second channel to a transceiver which operates at approximately 115 kHz (more precisely, 10 MHz÷86 6/7). This frequency has a non-integer relationship to the 10 MHz clock (86 6/7).

Figure 4:
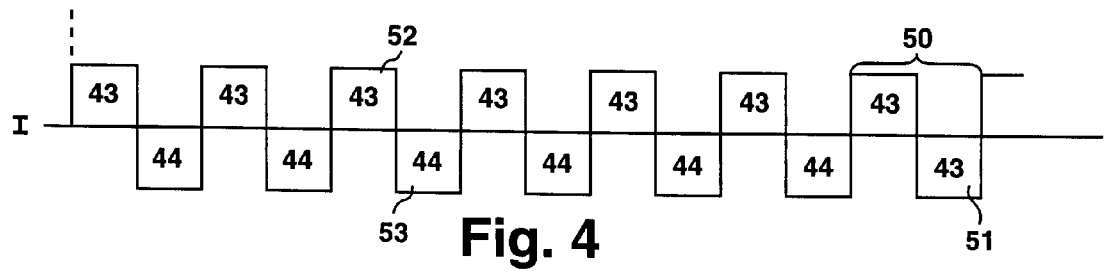
FIG. 4 illustrates an alternate digital waveform, this signal is used to describe the method for defining a digital waveform.

One method of obtaining the desired local oscillator frequency for the 115 kHz channel is shown in FIG. 4. Segments corresponding to "half" cycles having 43 and 44 counts (such as segments 52 and 53) of the 10 MHz clock can be used. As shown 6 "almost periodic" cycles consisting of a 43 count segment and a 44 count segment for each cycle, followed by a last cycle 50 having 43 counts in both segments are used. This provides the exact number of total counts to accurately obtain the frequency needed.

The waveform of FIG. 4 (as well as other waveforms with segments rearranged) produces some spurious modulation frequencies in the I and Q channels because the waveform is not truly periodic for every cycle. If these modulation frequencies are far enough removed from the base band frequencies of the converter, degradation of the receiver can be avoided. Numerous factors, however, can affect spurious frequencies introduction beyond the shortened cycles or lengthened cycles of the local oscillator. For instance, if the local oscillator provides a square wave output, this signal contains odd multiples of the oscillator fundamental frequency. All these factors can result in an output waveform of the receiver having undesirable characteristic. One such undesirable characteristic is the existence of frequency components at the output which have the same value as the information, but are caused when the input waveform has no frequency components near the local oscillator fundamental frequency. These result in what is sometimes called spurious input frequency noise. If this noise is relatively large compared to the size of the desired output waveform when information is present, the receiver performance will be degraded.

Figure 6:
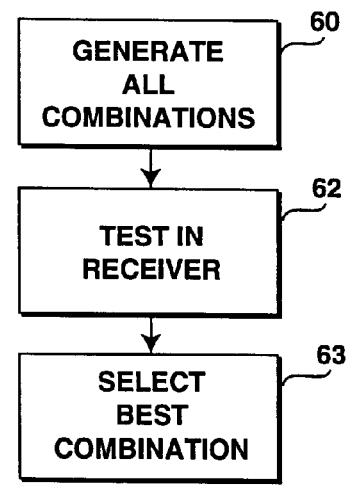
FIG. 6 illustrates the method of the present invention.

With the present invention many, if not all, of the combinations of the segments needed to produce the desired predetermined local oscillator frequency, are generated and shown by block 60 of FIG. 6. Each of these combinations is then tested in a receiver or in a simulation to determine the extent of degradation for that waveform, if any. This is shown by block 62. Then from these test results, the combination of segments that provided the best results or some desired characteristic is selected as shown by block 63. This generally results in the selection of a waveform where the counts in the segments are irregularly distributed over a full cycle of the waveform.

One test that may be conducted is to check the amplitude and phase of the I and Q signals in the base band in response to spurious input frequency noise. The I and Q signals should have the same amplitude but shifted by 90°. To the extent that this does not occur, there is a degradation in receiver performance.

Another test is to determine how tolerant a given waveform is to introduction of noise, assuming some fixed error rate.

In some cases it may not be necessary or practical to test all combinations, rather by testing a subset of all combinations of segments, a combination may be selected that provides the needed result. Moreover, selecting a combination may not be made on a single criterion such as performance in a given channel. For instance, a combination that provides good performance in the channel it is used in, may result in crosstalk from another channel. Thus, several criteria may be weighed in selecting a combination.

Additionally, other considerations may limit the number of combinations of segments that are tested. As an example, a particular duty cycle (such as 50%) may limit the number of combinations to only those cycles made up of two segments with approximately the same count. Balanced high and low states may be another consideration that limits the number of combinations. This is true for the waveforms of FIG. 3. Note that over the full period of seven cycles there are as many counts for high signal levels as for low signal levels. Another consideration may be to keep the I and Q waveforms close to 90° apart.

For a more specific example assume, as shown in FIG. 4, that to divide the 10 MHz clock down to a local oscillator frequency for the 115 kHz channel, repeated alternate segments of 43 and 44 counts are needed for six almost periodic cycles followed by an extra 43 count as shown by the cycle 50 in FIG. 4. This represents one combination of the segments needed to provide the desired frequency. Another combination would be, for example, to interchange the counts for the segments 52 and 53 for the waveform in FIG. 4. This would provide the same average period for the entire full period but with a slightly different frequency content. Ideally, all combinations of the different counts are tried and each tested to determine which provides the most desired performance in the receiver or other equipment.

Figure 3:
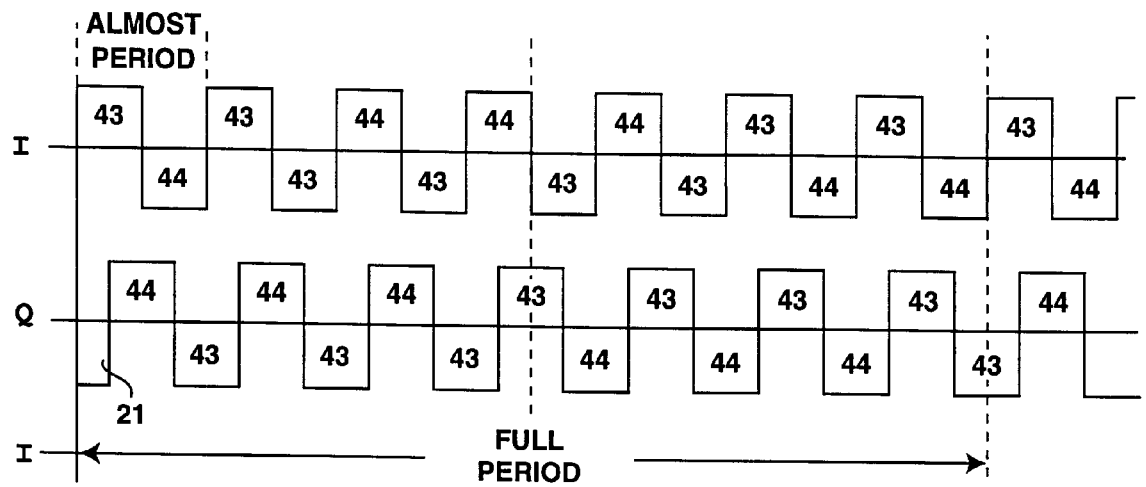
FIG. 3 illustrates the waveform of the local oscillator signal generated by the apparatus of FIG. 2.

This was done for a particular receiver and the waveform shown in FIG. 3 was selected as providing the best overall performance in the receiver for the 115 kHz channel. As can be seen, first there is an approximately 90° delay in the I channel as shown by the "half" segment (with 21 counts). In both the I and Q channels for each full, truly periodic period (made up of seven almost periodic cycles) there are eight segments having 43 counts and six segments having 44 counts. Each of the almost periodic cycles includes two segments having either 43 or 44 counts in the first segment and 43 or 44 counts in the second segment. Thus, the selected sequence of "43s" and "44s" is repeated for every seven of the almost periodic cycles. This selected sequence for the I channel, specifically 43, 44 43, 43, 44, 43, 44, 43, 44, 43, 43, 44, 43, 44 and the selected sequence for the Q channel (specifically, 44, 43, 44, 43, 44, 43, 43, 44, 43, 44, 43, 44, 43, 43 following the 21 "phase shift" counts) was selected after testing the receiver with many or all of the combinations.

Three other sequences of segments that were found to operate very well are:

I=43, 44, 44, 43, 44, 43, 43, 43, 44, 44, 43, 44, 43, 43

Q=(21) 44, 43, 43, 43, 44, 44, 43, 44, 43, 43, 43, 44, 44, 43

I=44, 44, 43, 43, 44, 43, 43, 44, 44, 43, 43, 44, 43, 43

Q=(22) 44, 43, 43, 44, 44, 43, 43, 44, 43, 43, 44, 44, 43, 43

I=44, 44, 43, 43, 43, 44, 43, 44,44, 43, 43, 43, 44, 43

Q=(22) 43, 44, 43, 44, 44, 43, 43, 43, 44, 43, 44, 44, 43, 43

In some cases it may be convenient to generate the combination pseudo-randomly. For the example of FIGS. 3 and 4, digital waveforms are generated having 8 segments of 43 counts and six segments of 44 counts in different orders with the order determined pseudo-randomly to provide the different digital waveforms which are to be tested in the receiver, or the like. There is no assurance that all combinations are tested with pseudo-random generation, however, a high confidence level can be achieved particularly where the test results show some pattern.

Figure 2:
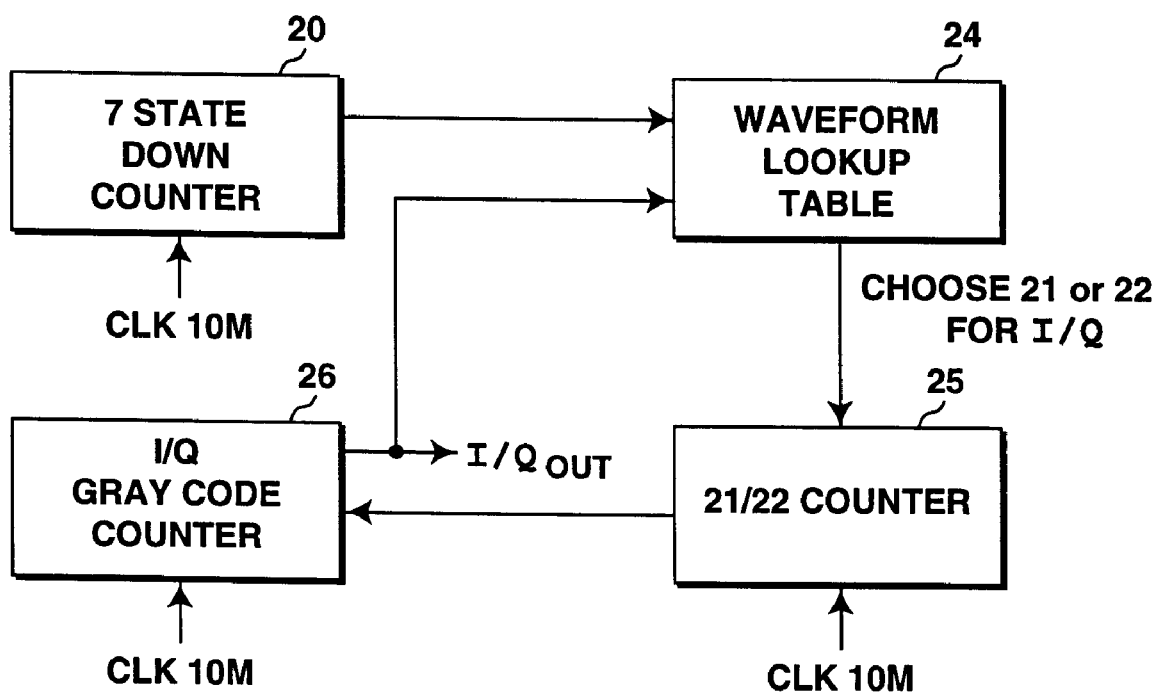
FIG. 2 is a block diagram of the apparatus used to generate the digital waveform (local oscillator signal) for an embodiment of the present invention.

The apparatus for generating the waveforms of FIG. 3 is shown in FIG. 2 and includes a seven state down counter 20.

Figure 5:
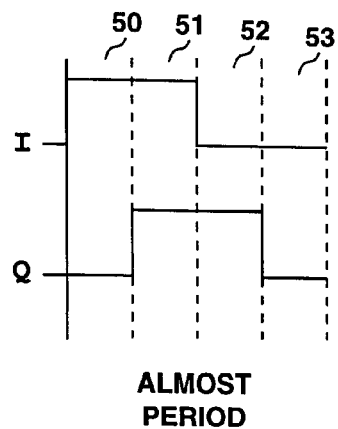
FIG. 5 is a graph used to describe the operation of the apparatus of FIG. 2.

The counter 20 starts counting down from six and wraps around at zero back to a count of six. During each of the seven states, the I and Q channel waveforms are as shown in FIG. 5. Each of the "half" segments represented, for instance, by 50 is either 21 or 22 counts. The 21 and 22 counting is provided by the counter 25. The waveform look-up table 24 stores the information for each of the channels needed to make up the segments for the waveform of FIG. 3. That is, the table stores the time relationship for each segment to the reference signal. For instance, during count six, the first count of the counter 20, the table indicates for the I channel that there is a 21 count needed for the half segment 50, followed by a 22 count for the half segment 51. Similarly, for the "half" segment 50 for the Q channel a count of 21 is needed followed by two counts of 22 for the half segments 51 and 52. The counter 26 advances at the terminal count of counter 25 and generates the waveform of FIG. 5 needed to complete the final waveform. When both the I and Q channels are in the low state as shown in FIG. 5, the down counter 20 is decremented. The counting is synchronized with the reference signal of 10 MHz.

Thus, a method and apparatus has been disclosed for providing a digital waveform optimized for use in a particular application where the digital waveform is not an integer submultiple of a reference signal.

We claim:

1. A method for providing a digital waveform which is derived from a higher frequency signal and wherein the digital waveform is made up of first segments having n counts of the higher frequency signal and of second segments having m counts of the higher frequency signal, the digital waveform periodically having a first predetermined number of first segments and a second predetermined number of second segments, comprising:

generating a plurality of the digital waveforms each of which has the first and second number of the first and second segments, respectively, with the first and second segments being differently arranged in each of the plurality of the digital waveforms;

testing each of the plurality of the digital waveforms in at least one predetermined test;

selecting one of the plurality of digital waveforms based at least in part on the testing.

2. The method defined by claim 1 wherein the plurality of digital waveforms comprises every combination of the first and second segments having the first predetermined number and second predetermined number of segments, respectively.

3. The method defined by claim 1 wherein the generation of the digital waveform is done by a pseudo-random process.

4. The method defined by claim 1 wherein the plurality of digital waveforms have a 50% duty signal over a complete cycle of the waveform.

5. The method defined by claim 1 wherein the plurality of digital waveforms have the same number of counts in a high state and a low state over a complete cycle of the waveform.

6. The method defined by claim 1 wherein the testing comprises using the plurality of digital waveforms as local oscillator signals in a receiver.

7. A method for defining a first and second quadrature, local oscillator signals based on a higher frequency reference signal each of the first signals being made up of first segments and second segments having a fixed relationship to the higher frequency signal and the second signal being made up of third and fourth segments having a fixed relationship to the higher frequency signal, comprising:

generating a plurality of the first signals having the first and second segments in different orders;

generating a plurality of the second signals each having the third and fourth segments in different order and each being in quadrature relationship to the plurality of a first signals;

testing the first and second signals so as to evaluate their performance as local oscillator signals in a receiver; and, selecting one of the first and second signals for use in the receiver.

8. An apparatus for generating a digital waveform having a plurality of segments which are repeated where each segment is based on a fixed time relationship to a reference signal, comprising:

a first counter for generating signals for controlling the repeating of segments;

a table for storing data representative of the fixed time relationships between the reference signal and each of the segments coupled to the first counter;

a second counter for counting intervals corresponding to the time relationship of the reference signal and the segments coupled to the table; and a circuit for providing the digital waveform, coupled to the second counter.

* * * * *